United States Patent [19]

Dahlberg

[11] 4,024,410
[45] May 17, 1977

[54] ALTERNATING CURRENT ENERGY CONVERTER

[76] Inventor: Reinhard Dahlberg, Innere Bergstrasse 32, 7101 Flein, Germany

[22] Filed: Feb. 19, 1975

[21] Appl. No.: 550,941

[30] Foreign Application Priority Data
June 5, 1974 Germany .......................... 2427060

[52] U.S. Cl. .................................... 307/2; 324/119
[51] Int. Cl.² ........................................ H02J 3/02
[58] Field of Search ................................ 307/1–5, 307/45, 72, 73, 77; 323/32; 324/119

[56] References Cited

UNITED STATES PATENTS

| | | |
|---|---|---|
| 2,833,988 | 5/1958 | Parnell .............................. 324/119 |
| 3,093,783 | 6/1963 | Hass ................................. 307/2 X |
| 3,702,939 | 11/1972 | Darrow .............................. 307/2 |

*Primary Examiner*—William M. Shoop
*Attorney, Agent, or Firm*—Spencer & Kaye

[57] ABSTRACT

An alternating current energy converter comprising a direct energy converter, the internal resistance of which is so connected into an alternating current circuit that current flows as rectified current therethrough and the reactance of the alternating current circuit is greater than the resistance of the direct energy converter.

16 Claims, 21 Drawing Figures

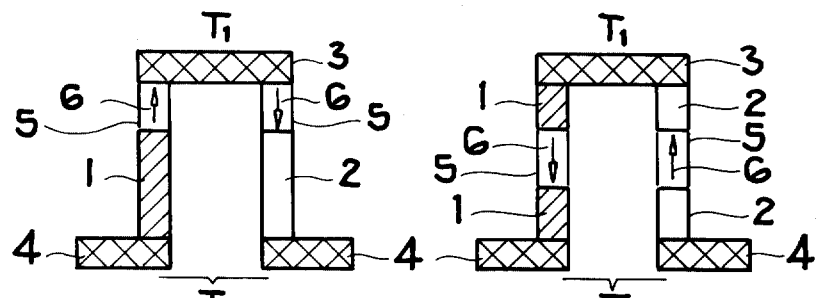
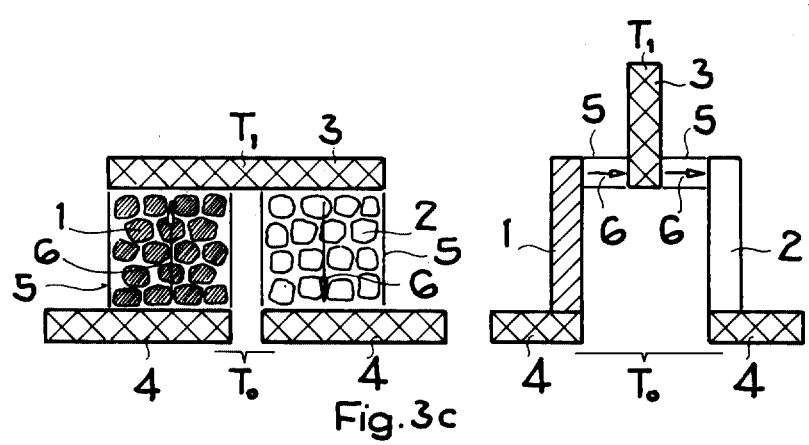
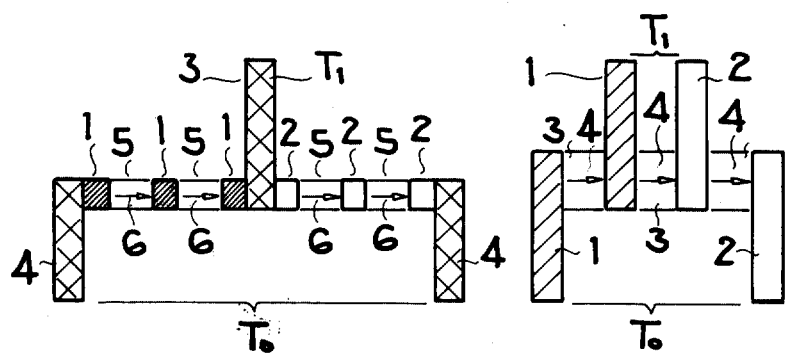

ns1,410

ALTERNATING CURRENT ENERGY CONVERTER

BACKGROUND OF THE INVENTION

This invention relates to alternating current energy converters. The so-called "direct energy conversion" with thermo-elements, thermionic diodes, photoelements, fuel cells, radio nuclide batteries, magnetohydrodynamic converters and so on today still has a series of disadvantages. All direct energy converters produce direct current. In practice however, in the majority of all applications, alternating current is used, which must be produced first from the direct current by means of expensive inverters. Some direct energy converters moreover also produce only an inconveniently small direct voltage - such as, e.g. thermo-elements - or, however, an inconveniently large direct voltage - such as, direct nuclide batteries. Also the internal resistance, rising in fuel cells as a result of the polarisation of the electrodes with stronger outer loading, is disadvantageous and inconvenient. The high efficiency of the energy conversion of fuel cells is, as a result thereof, capable of being realised only for relatively small outer loads.

A too small efficiency of the energy conversion is generally speaking the most difficult predominant disadvantage in all direct energy converters.

The present invention starts from the knowledge that an improvement in the efficiency of direct energy converters is possible if it is possible to reduce the electrical internal resistances of the direct energy converters.

SUMMARY OF THE INVENTION

It is an object of the invention to provide an "alternating current energy converter" with reduced internal resistance and which obviates some or all of the above described disadvantages of direct energy converts.

According to a first aspect of the invention, there is provided an alternating current energy converter comprising a direct energy converter, an alternating current circuit in which the internal resistance of said direct energy converter is connected for current flow as rectified current therethrough with a reactance of said alternating current circuit for restriction of the intensity of said rectified current.

According to a second aspect of the invention, there is provided an alternating current energy converter, characterised in that the electrical internal resistance of a direct energy converter is so connected into an alternating current circuit that the electrical alternating current flows as rectified current through said electrical internal resistance of said direct energy converter and in that the reactance of said alternating current circuit is greater than the electrical internal resistance of said direct energy converter.

BRIEF DESCRIPTION OF THE DRAWINGS

The invention will now be described in greater detail, by way of example, with reference to the drawings in which:

FIG. 3a to 3f show schematically embodiments of the invention using thermo elements with at least one interruption point.

DESCRIPTION OF THE PREFERRED EMBODIMENTS

Figure 1:
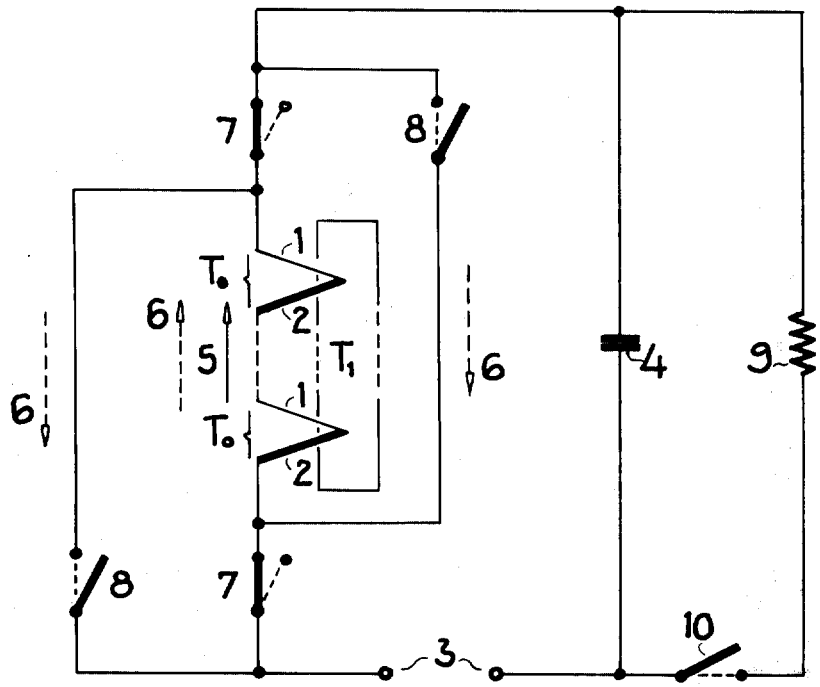
FIG. 1 shows schematically an embodiment of the invention using a thermo electric generator.

Basically the invention proposes an alternating current energy converter in which the electrical internal resistance of a direct energy converter is connected into an alternating current circuit in which means are provided by which a current flows as a rectified current through said electrical internal resistance of said direct energy converter and in which a reactance is provided for limiting the current in said alternating current circuit.

The following examples will now be described, referring to the drawings:

EXAMPLE 1

Figure 2:
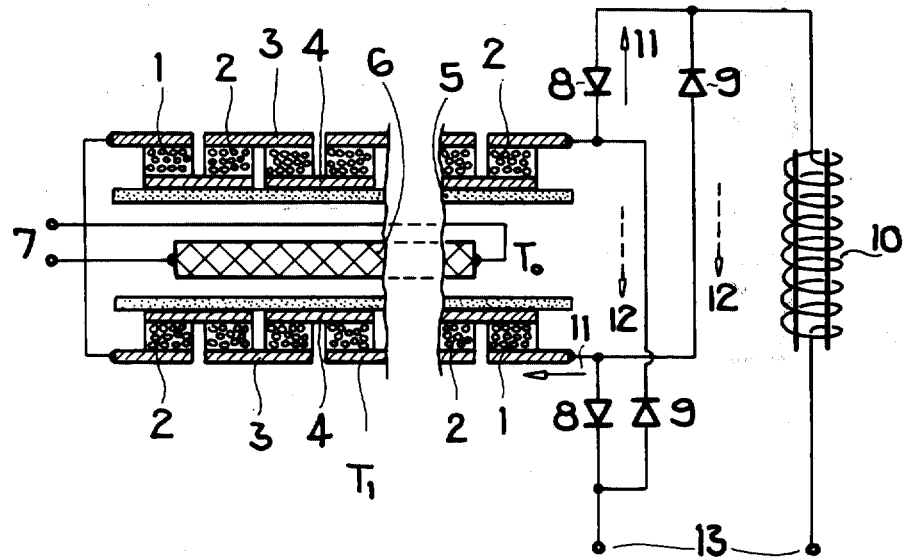
FIG. 2 shows schematically an embodiment of the invention using a Peltier column or thermopile.

In FIG. 1, 1 and 2 are the thermo-legs of a thermo electric generator. The hot contact points of the generator are maintained at the temperature $T_1$, the cold contact points of the generator are kept at the temperature $T_o$, and the generator has a floating voltage of 100 volts. Its internal electrical resistance, which is formed from the sum of all the resistances of the thermolegs 1 and 2, amounts to 5 ohms. The capacitor 4 has a capacitance of 144 microfarads and a capacitative reactance of 22 ohms at 50 hertz. The alternating current source 3 has an effective controllable voltage of 0 to 440 volts and a frequency of 50 hertz. The electron current 5 is fed by means of the switches 7 and 8 which are opened and closed in push-pull in each case on the zero axis crossover of the alternating current, during the first half wave just as the electron current 6 is fed during the second half wave in the same direction through the internal resistance of the thermoelectric generator. The direction of the currents 5 and 6 through the internal resistance of the thermo-electric generator is so chosen that the direct voltage of the thermo-electric generator is added to the alternating voltage in each half wave. If, in the case of the opened switch 10, the alternating current source 3 is adjusted to an effective voltage of 440 volts, then an effective alternating current of 20 amperes flows through the alternating current circuit. The voltage drop across the internal resistance of the thermo-electric generator is, as a consequence of this alternating current, in the chronological mean value, inversely the same size as the floating voltage of the thermo electric generator. Both voltages rise in the centre and the current through the alternating current circuit is a pure reactive current restricted by the reactance of the capacitor 4, if all the other resistances and losses of the circuit relative to the internal resistance of the thermo-electric generator can be neglected. If the effective voltage of the alternating current source 3 is reduced to 220 volts, then the effective current in the alternating current circuit falls back to 10 amperes. If the load resistance 9 with a resistance value of 97 ohms is applied parallel to the capacitor by closing the switch 10, the load resistance 9 then assumes, at 220 volts effective voltage at the capacitor 4, an electrical power of 500 watts. This alternating current power of 500 watts originates completely from the thermo-electric generator. The alternating current source 3 does not emit any power, because the voltage drop across the internal resistance of the thermo-electric generator is now already compensated by half the floating voltage of the thermo-electric generator. The alternating current power of 500 watts could be assumed also by a load resistance of 5 ohms, instead of resistance 9, which is connected in series with the capacitor 4. The power of 500 watts, of course, could be assumed also as direct current power by a load resistance of 5 ohms, instead of resistance 9, which is connected in series with the thermo-electric generator and in between the pairs of switches 7 and 8.

The increase in the efficiency over the reduction of the internal resistance of a direct energy converter through the alternating current energy converter is illustrated in example 2.

EXAMPLE 2

In FIG. 2, a Peltier column or thermopile for low temperature cooling of a superconducting arrangement is described. 1 and 2 are the $p$ leg and $n$ leg of the Peltier column. Gallium arsenide with a zinc doping of approximately $5.10^{16}$ zinc atoms per $cm^3$ is used as material for the $p$ leg and gallium arsenide with a tin doping of approximately $2.10^{18}$ tin atoms per $cm^3$ is used for the $n$ leg. Both materials are finely powdered. The powder grains have a particle size smaller than 25 micron. Each element leg has a length of one millimeter, a cross-section of $10^{-2} cm^2$, and it comprises gallium arsenide powder of $p$ or $n$ type conductivity which is compressed only to 100 kilopond. The intermediate space between the gallium arsenide powder grains is evacuated to a vacuum pressure smaller than 1 Torr. The contact bridges 3 between the element legs 1 and 2 are kept to the temperature $T_1$ of the liquid nitrogen. The contact bridges 4 are the "cool points" of the Peltier column from 80 Peltier elements in all, which are arranged concentrically and according to length around a ceramic tube 5. The cool points 4 cool the ceramic tube 5 down to the temperature $T_o$. 13 is an alternating current source at 60 hertz and an effective voltage of 160 kilovolts. 10 is a high voltage inductor with an inductance of 500 henry, which represents an inductive reactance of approximately 188 kilohms. The electron currents 11 and 12 flow through the high vacuum rectifiers 8 and 9 which are connected in push-pull, in the positive and negative phase or half wave in one direction through the elements legs 1 and 2 of the Peltier column. The internal resistance of the Peltier column is extremely high at low voltages, because the contact resistance between the powder grains of the gallium arsenide adds up to a very high resistance amount. These contact resistances, however, are also very strongly dependent on the voltage or more accurately on the electrical field strength between the powder grains. Since the currents 11 and 12 owe their origin to a very high voltage, there are between the gallium arsenide powder grains at the start of each half wave of the alternating current 11 and 12 very high field strengths for a short time, which make the contact resistances break down reversibly. In so doing the internal electrical resistance of the Peltier column at each current passage of the currents 11 and 12 falls by many orders of magnitude and becomes substantially smaller than the inductive reactance of the coil 10. The effective current of 850 milliamperes is thus restricted to this value only by the coil 10. Since the thermal conductivity of the powderform element legs without current passage is extremely small, only the electron thermal conductivity with the passage of the currents 11 and 12 count as heat conductivity of the element legs 1 and 2. At simultaneously high thermo-electric force of the $p$ type and $n$ type gallium arsenide, for this reason, the alternating current energy converter with the Peltier column has such a high efficiency that cooling temperatures $T_o$ are achieved at which a superconducting arrangement 6 can be driven via the electrical connections 7. Instead of a single phase alternating current source 13, of course, a three phase alternating current source could also be used, if a separate coil 10 is provided for each phase and if a three phase rectification bridge is used.

Still lower temperatures at simultaneously greater heat pump powers can be achieved if the Peltier column according to FIG. 2 is constructed in manner, known per se, in the form of a multistage cascade.

On account of the high efficiency of the energy conversion, the alternating current energy converter with Peltier elements can be advantageously used for reversible cooling, by simple current reversal, for reversible heating and for the air-conditioning of rooms, buildings, appliances, equipment and so on.

Example 2 shows that, in the case of non-metallic thermo-elements of Peltier elements, the efficiency of the energy conversion can be improved, if the heat loss which results through the thermal lattice conduction of the element legs is avoided. When using thermo-elements or Peltier elements with at least one interruption point the thermal lattice conduction is interrupted, but the electrical current can be allowed to flow in an alternating current energy converter by means of electrical discharges, breaking through in an arc-like or in a spark-like manner, via these interruption points with an adequately low resistance.

By said arc-like or spark-like electrical discharges are to be understood all electrical discharges in gases of arbitrary pressure and arbitrary degree of ionization, in which the current/voltage characteristic partially is negative. These spark-like or arc-like electrical discharges are also known as vacuum discharges in the case of extremely low pressure. As measured by the total energy fed through, as spark-like electrical discharge is itself, in general, relatively small. This fits the strongly negative current/voltage characteristic. Spark gaps are therefore also suitable, as is well known, as low loss switches in low resistance surge current circuits, such as, in thermal wire blow outs by capacitor/short circuit discharges. Also radio transmitters, which are already historical today, function above all because the spark gap in the transmitter resonant circuit is of such low resistance that damped natural oscillations can build up in the transmitter resonant circuit away from the spark gap.

Use can be made in the alternating current energy converter of the property of a spark-like electrical discharge of feeding much energy without using too much energy itself. The spark-like electrical discharge produces for a short time an extremely hot and correspondingly low resistance plasma. The hot plasma, however, uses up its energy only to a small extent by radiation and electron thermal conduction. The greater part of the plasma energy is passed on the discharge circuit by a generator. The ratio of uses to transmitted energy strongly depends on the data of the circuit. The ratio is, inter alia, however, the smaller, the greater is the field strength at the start of the spark-like electrical discharge and the greater the maximum discharge current is.

FIGS. 3a to 3f show schematically a few examples of thermo-elements with at least one interruption point.

EXAMPLE 3

In FIG. 3a, 1 is the p leg, 2 the n leg of the thermoelement, and 3 is a metallic bridge at the temperature $T_1$. 4 are metallic feed lines (at temperature $T_o$) to the element legs 1 and 2. The two interruption points 5 which can be plasma, gas or vacuum gaps, are bridged by the spark-like electrical discharges 6.

FIG. 3b shows a thermo-element, the legs 1 and 2 of which each have an interruption point 5 which are bridged by the spark-like electrical discharges 6. 3 is a metallic bridge (at temperature $T_1$) between the legs 1 and 2, and 4 are metallic feed lines with the temperature $T_o$.

FIG. 3c shows schematically a thermo-element, the element legs 1 and 2 of which comprise powder form thermo-electrical material as in the example of FIG. 2. The interruption points 5 are here the intermediate spaces and limit surfaces between the powder grains. They are bridged by the spark-like electrical discharges 6. The conducting bridge 3 has the temperature $T_1$ and the feed lines 4 is at the temperature $T_o$.

FIG. 3d show schematically a thermo-element, in which the metallic bridge 3 (at temperature $T_1$) is parallel to the element legs 1 and 2. The interruption points 5 are bridged by the spark-like electrical discharges 6. 4 are metallic connections at temperature $T_o$.

FIG. 3e shows schematically a thermo-element in which the metallic bridge 3 (at temperature $T_1$) and the feed lines 4 (at temperature $T_o$) run in parallel. The thermo-legs 1 and 2 each have two interruption points 5 which are bridged by the spark-like electrical discharges 6.

FIG. 3f shows schematically a thermo-element in which two thermo-legs 1 and 2 are at the temperature $T_1$ and two thermo-legs 1 and 2 at temperature $T_o$ are held constant. All thermo-legs 1 and 2 are separated by interruption points 3, which are bridged by the spark-like electrical discharges 4. The thermo legs 1 and 2 at temperature $T_1$ can also be formed by the p-zone and the n-zone of a semiconductor p-n junction which, during the spark-like electrical discharges 4, is flown through in an electrical broken down state or in forward direction by the rectified current. Both the hot and the cold contact points of the thermo-legs 1 and 2 can be constructed by p-n- junctions in a cascade corresponding to FIG. 3f.

EXAMPLE 4

Figure 4:
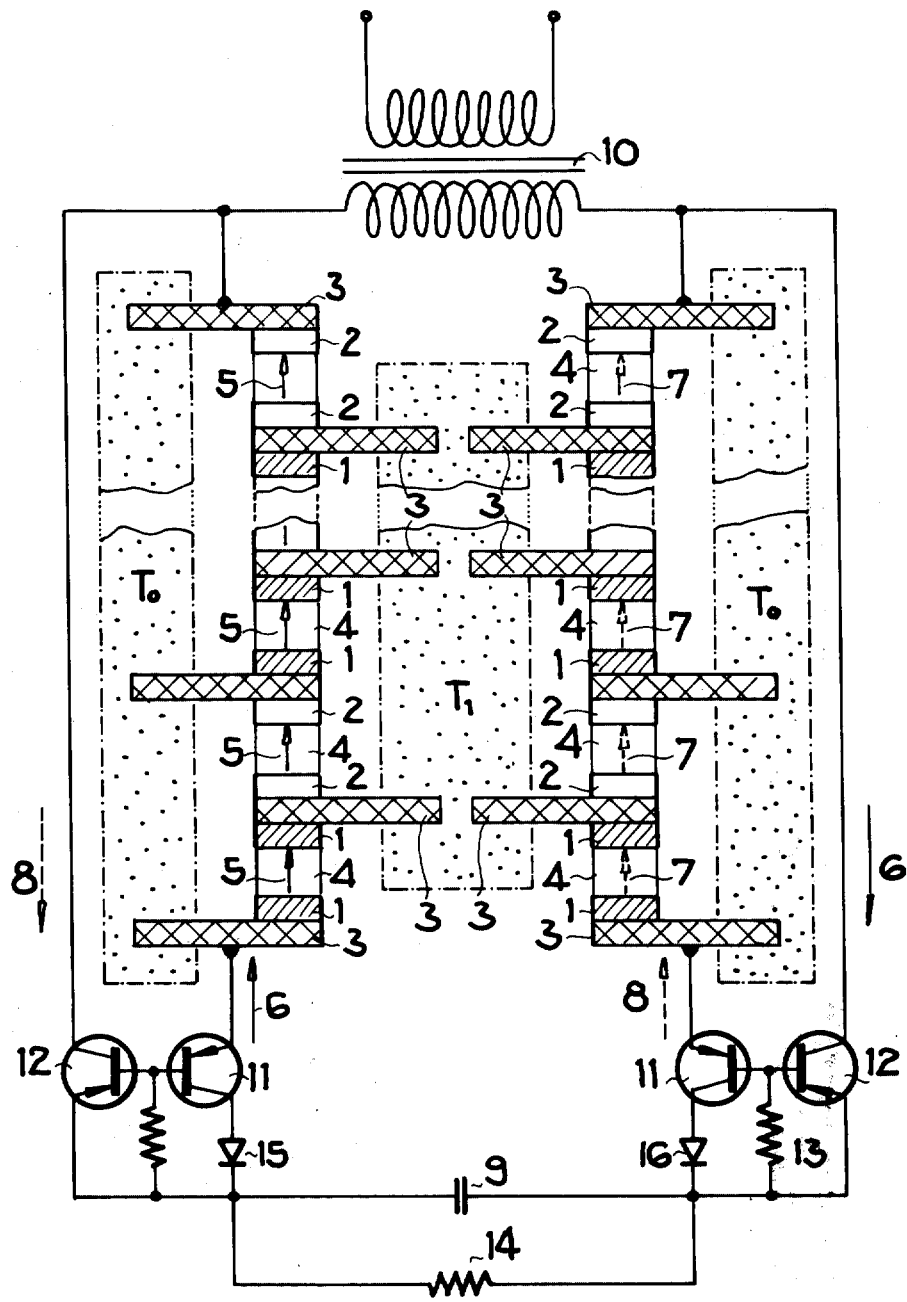
FIG. 4 shows schematically an embodiment of the invention using two thermo electric generators with interruption points.

In FIG. 4 is shown an alternating current energy converter which contains two thermo-electric generators with interruption points. The element legs 1 and 2 comprise silicon of $p^+$ and $n^+$ type conductivity of 0.5 milliohms cm, in the form of monocrystalline chips of 1 $cm^2$ area and $4.10^{-3}$ cm thick. The $p^+$ chips have, on one side, an epitaxial p layer of 0.01 ohms of a thickness of $1.10^{-4}$ cm. The $n^+$ chips carry a corresponding layer of n type conductivity. On the non-epitaxial side, the silicon chips are so alloyed on to the metallic bridges and feed lines 3 that always two p epitaxial layers and two n epitaxial layers are opposite each other and touch each other slightly. The very narrow intermediate space 4 is evacuated. The hot contact bridges 3 are maintained at a temperature of $T_1$ of 800° kelvin by solar irradiation and the cold contact bridges and feed lines 3 at a temperature of $T_o$ of 300° kelvin by cooling. Each other two thermoelectrical generators has an open-circuit voltage of 300 volts. An effective alternating voltage of 3,000 volts at a frequency if 1 kHz is applied to the alternating current circuit by the relatively low resistance secondary coil on the transformer 10. The capacitive reactance of the capacitor 9 amounts to 300 ohms, and an effective current of 10 amperes flows through the alternating current circuit. The electron current 6 in the first half wave flows through the complementary transistors 11 and 12 operating in push-pull in the emitter circuit with the help of the resistances 13, through the conducting rectifier 15, the pnp transistor 11 through the lefthand thermo-electric generator and through the npn transistor 12, wherein the interruption points 4 in the element legs 1 and 2 are bridged by the spark-like discharges 5. In the second half wave the electron current 8 flows through the conducting rectifier 16, the pnp transistor 11, through the right-hand thermo-electrical generator and through the npn transistor 12, wherein the interruption points 4 in the element legs are bridged by the spark-like discharges 7. The alternating current fed in by means of the transformer 10 provides practically no power whereas approximately 1.5 kilowatts of electrical power is taken from the two thermoelectric generators as an alternating current of 1 kHz through a load resistance 14 of 6 kiloohms.

The hitherto described alternating current energy converters can operate with alternating voltages of any amplitude. Sinusoidal amplitudes can be used or even square wave amplitudes, as supplied by e.g. multivibrators, saw-tooth amplitudes, as occur in the case of relaxation oscillations, and so on.

An important special case of the alternating current energy converter of the invention is present if the alternating current circuit is a resonant circuit or resonator, which can carry out resonant oscillations or natural oscillations. An alternating current energy converter as a resonant circuit with thermionic diodes as direct energy converter is described in example 5.

EXAMPLE 5

Figure 5:
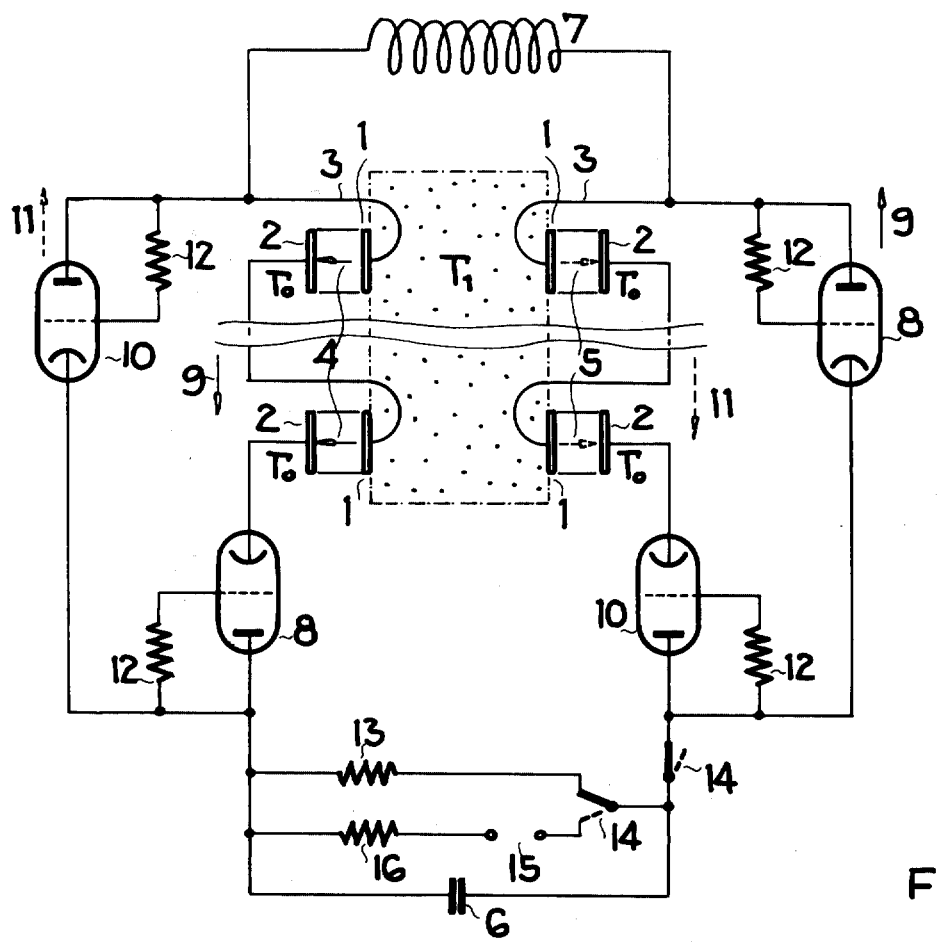
FIG. 5 shows schematically an embodiment of the invention using thermionic diode batteries.

In FIG. 5, 1 are the tungsten emitters of two thermionic diode batteries. The temperature $T_1$ of the emitters 1 amounts to 2,800° kelvin. It is produced by the combustion of hydrogen gas with oxygen. The collectors 2 likewise comprise tungsten and are kept at a temperature of 500° kelvin. The size of the surfaces of the emitters 1 and of the collectors 2 each amount to 10 $cm^2$. The spacings between the emitters 1 and the collectors 2 amount to 3 mm. They are filled with caesium vapour under a pressure of $7.10^{-2}$ Torr. In each thermionic diode battery, 100 thermionic diodes are connected in series through the emitter feed lines 3. The open-circuit voltage of each battery amounts to 250 volts. The vacuum capacitor 6 has a capacitance of 100 picofarads and the coil 7 has an inductance of 2.53 microhenry, so that the natural frequency of this resonant circuit amounts to approximately 10 MHz. If the capacitor 6, after switch over of the switch 14, is charged by the direct voltage source 15 across the resistance 16 to 32 kilovolts and thereafter the switch 14 is switched back again, then a oscillation of 10 megahertz with reduced damping is excited in the resonant circuit.

However the resonant circuit is dampened by the resistance 13 of 20.5 kilohms. As a result thereof, an effective alternating current of only 100 amperes flows through the resonant circuit and the effective voltage at the capacitor drops to 16 kilovolts. The vacuum triodes 8 and 10 are controlled in push-pull by means of the resistances 12. They cause, in the first half wave, the electron current 9 to flow through the left-hand thermionic diode battery and, in the second half wave, the electron current 11 to flow through the right-hand thermionic diode battery. Since the resonant circuit, in spite of the damping of the load resistor 13, has a Q storage factor of 64, a relatively high overvoltage is applied for a short time at each individual thermionic diode after each application of the currents 9 or 11. They cause the space charge 4 and 5 before the emitter to be disrupted and an effective current of 100 amperes can flow. A reduction in the internal resistance of the thermionic diodes is caused by this reduction in the space charges. With this, the relative portion of the heat losses in the energy balance is reduced, that means, however, the efficiency of the thermionic diodes becomes greater. The load resistance 13 assumes a high frequency power of more than 20 kilowatts, which is emitted by the thermionic diodes. The maximum efficiency of conversion of heat to electricity in example 5 is about 40 %.

Alternating current energy converters can also contain direct energy converters which convert light into electrical energy or electrical energy into light, such as, solar cells, photoelements, photocells, photodiodes, electro-luminescence diodes and laser diodes.

EXAMPLE 6

Figure 6:
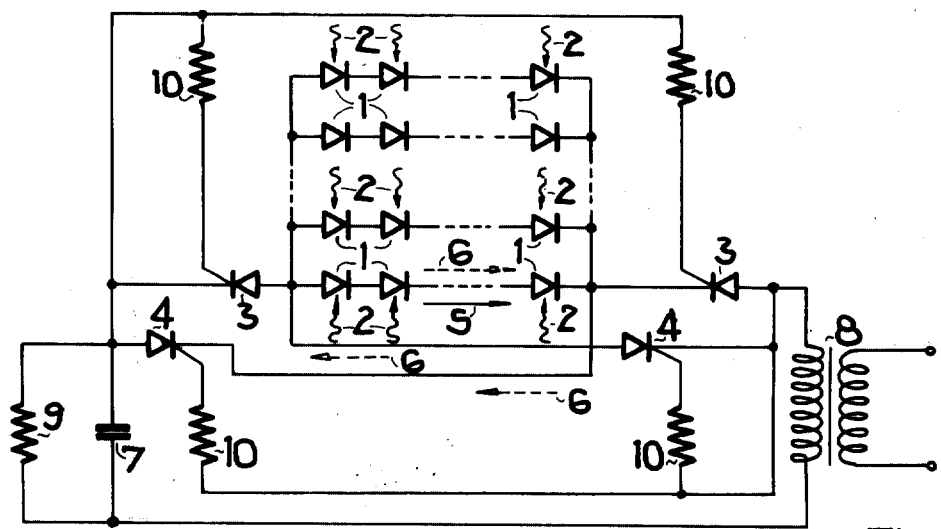
FIG. 6 shows schematically an embodiment of the invention using solar cells.

In FIG. 6 an alternating current energy converter with a parallel and series circuit of silicon solar cells 1 is described, which collect the radiation of light 2 of the sun. Each solar cell is 2 × 2 $cm^2$ large and has an open-circuit voltage of 0.6 volts and a short circuit current of 150 milliamperes. Every 50 solar cells are connected in parallel and 500 of these parallel circuits are connected in series. By means of the secondary coil of a transformer 8, an effective alternating voltage of 300 volts and 5 hertz is applied to the alternating current circuit through the capacitor 7, which has a capacitance of 80 microfarads. An effective alternating current of 7.5 amperes flows through the circuit. It is guided in the same way through the solar cells 1 through the thyristors 3 and 4 controlled in push-pull by means of the resistances 10 during both alternating current half waves 5 and 6. The load resistance 9 parallel to the capacitor 7 assumes, with a resistance value of 40 ohms, an alternating voltage power of approximately 2.2 kilowatts at an effective voltage of 300 volts. The efficiency of the solar cells 1 is somewhat greater than in normal operation in the alternating current energy converter.

Exemplary embodiment 7 describes an alternating current energy converter with a direct energy converter which converts electrical energy into light.

EXAMPLE 7

Figure 7:
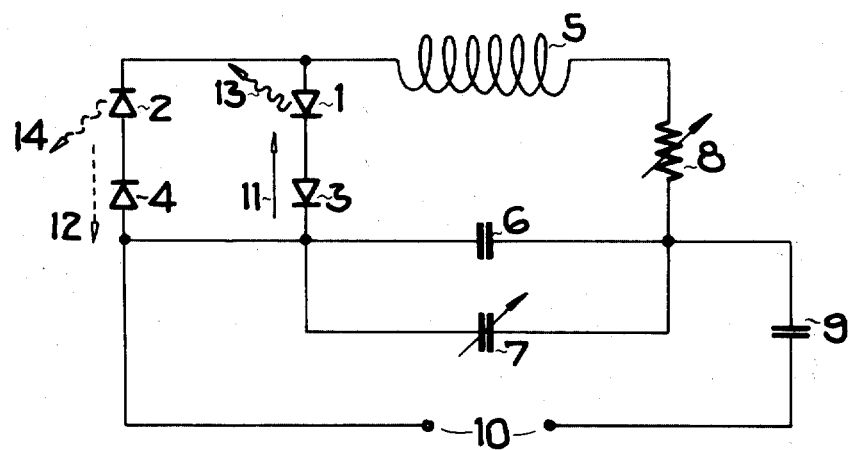
FIG. 7 shows schematically an embodiment of the invention using laser diodes.

In FIG. 7, 1 and 2 are gallium arsenide laser diodes, which are located in a resonant circuit with the coil 5 and the capacitors 6 and 7. The coil 5 has an inductance of $3.17 \cdot 10^{-8}$ henry, and the capacitor 6 a capacitance of 60 picofarads. The variable capacitor 7 has a capacitance of 20 to 80 picofarads. The resonant frequency of the resonant circuit can be modulated between 70 and 100 megahertz by means of this variable capacitance. 8 is a variable resistance by means of which the amplitudes of the oscillations can be modulated. In the first half wave, the electron current 11 flows through the laser diode 1, which emits the infrared light pulse 13 in so doing. In the second half wave the electron current 12 flows through the laser diode 2, which emits the infrared light pulse 14 in so doing. A high frequency generator 10 is coupled to the resonant circuit by means of the capacitor 9. The light pulses 13 and 14 can be modulated by the modulation of the capacitor 7 and of the resistance 8 even with a constant frequency of the high frequency generator 10.

Alternating current energy converters can also be used with direct energy converters, which convert chemical energy into electrical energy or electrical energy into chemical energy, e.g. fuel elements with gaseous our liquid fuels, which operate with low or high temperatures, electrolytic primary elements, electrolytic secondary elements and so on.

An alternating current energy converter, which contains fuel cells as direct energy converters, is described in example 8.

EXAMPLE 8

Figure 8:
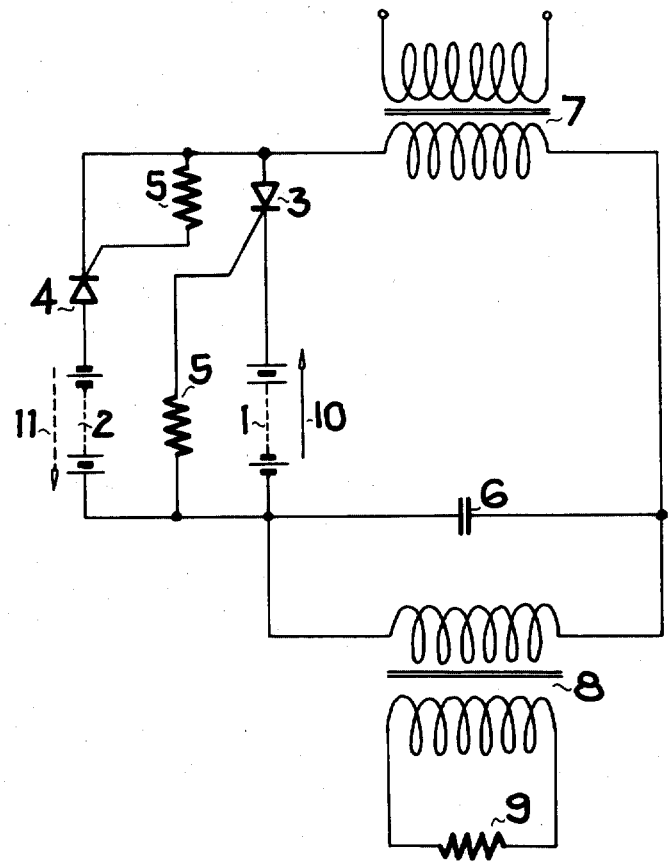
FIG. 8 shows schematically an embodiment of the invention using fuel cells.

In FIG. 8, 1 and 2 are batteries each of 100 fuel cells with so-called "double-skeleton hydrogen electrodes," which contain precipitated silver powder in an supporting frame of carbonyl nickel. The reaction water is produced as steam and each fuel cell has an open circuit voltage of 1.18 volts. The electrode surface of each cell amounts to $10^4 cm^2$. The batteries 1 and 2 are connected by means of the thyristors 3 and 4 (controlled by the resistances 5) in push-pull into the alternating current circuit through the capacitor 6. An alternating voltage of 60 hertz and 2,000 volts effective voltage is applied to the alternating current circuit by means of the secondary side of the transformer 7. The capacitor 6 has, with a capacitance of 1,330 microfarads, a capacitative reactance of 2 ohms, so that an effective alternating current of 1,000 amperes flows through the batteries 1 and 2 with the half waves of the electron current 10 and 11. Parallel to the capacitor 6 is the oil transformer 8, which transmits an effective power of approximately 115 kilowatts at an effective secondary voltage of 40 kilovolts to the load resistance 9 with approximately 4 kilohms. The transformer 7 emits practically only reactive power. No polarization or excess voltage can form at the electrodes of the fuel cells as a result of the relatively high voltage at the capacitor 6. This acts like a reduction of the internal resistance of the fuel cells and leads to an improvement in the efficiency of the energy conversion at high loading.

The alternating current energy converter of the invention can be used up to the highest of all frequencies. Its use as a microwave generator is described in example 9.

EXAMPLE 9

Figure 9:
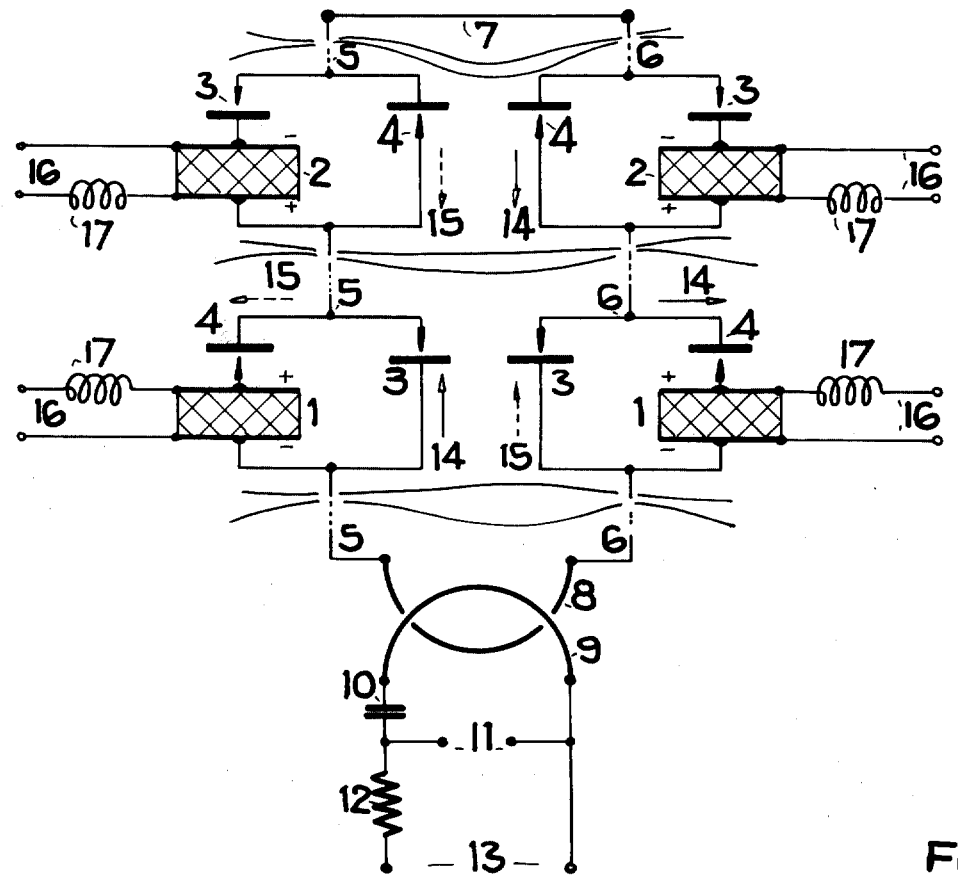
FIG. 9 shows schematically an embodiment of the invention using lead accumulators.

In FIG. 9, 1 and 2 are lead accumulators with an open circuit voltage of 2.1 volts and an internal electrical resistance of 10 milliohms. 5 and 6 are so-called Lecher or two wire resonant lines with a total length of 3 meters. They are short circuited at the upper end by a conducting bridge 7 and are connected together at the lower end by the induction loop 8. In each Lecher line 5 or 6 there is connected in each case, at a spacing of 15 centimeters, a parallel circuit alternating with an accumulator 1 and 2 as well as two spark gaps 3 and 4. Each Lecher line 5 and 6 contain nineteen lead accumulators 1 and 2, which are changed from the direct current sources 16 by means of the inductors 17. The spark gaps 3 and 4 comprise in each case, a metal plate which is opposite a metal point. If the point is positive, then the spark break-down voltage is only about half as high as in the case of a reversed electrical polarity. If the capacitor 10 is charged to such a high voltage by means of the resistance 12 through the direct voltage source 13, that the ball type spark gap 11 is disruptively discharged, then the capacitor 10 is discharged through the induction loop 9 and through the spark gap 11 in the form of a dampened oscillation of 1 gigahertz. Since this frequency is a resonant frequency of the Lecher lines 5 and 6 terminated by means of the resonant loop 8 and the bridge 7, the electron currents 14 and 15 flow through the Lecher resonator in the first second half wave respectively. Since the currents 14 and 15 always so flow through the spark gaps 3 and 4 and the lead accumulators 1 and 2, the accumulator voltages are added to the high frequency alternating voltages and a standing wave of reduced dampening results in the Lecher resonator. The wave resistance of the Lecher line amounts to 300 ohms and the total resistance inclusive of the internal resistance of the lead accumulators 1 and 2 is 0.3 ohms in each half wave. Therefore, without outer damping, an effective alternating current of 147 amperes flows through the Lecher resonator. If the Lecher resonator is damped through the induction loop 8 by a useful resistance of approximately 300 kilohms, then the effective alternating current in the Lecher resonator falls to about 73 amperes and a microwave power of 1.6 kilowatts at 1 gigahertz with an effective alternating voltage of 22 kilovolts is taken from the Lecher resonator by the damping. The efficiency of the production of usable microwave power depends on the degree of damping. By the damping with 300 kilohms it amounts to approximately 50 %. By stronger damping of the Lecher resonator with a smaller load resistance the efficiency can be further improved - with the total power becoming smaller at the same time.

The two Lecher lines 5 and 6 in FIG. 9 can be replaced in manner, known per se, also by a coaxial line or a coaxial-line resonator, which is desirable for the greater avoidance of radiation losses. A plurality of generators can be connected in parallel and in series to increase the microwave power. In this way microwave power stations can be built - even using different direct energy converters, such as, fuel cells, thermo-elements or MHD converters.

The alternating current energy converter can also be used with advantage with direct energy converters, which convert radioactive radiation into electrical energy, such as, direct radionuclide batteries, semiconductor/barrier layer batteries and contact potential batteries. Example 10 describes an alternating current energy converter which contains a radionuclide battery, i.e. a direct energy converter with an inconveniently high direct voltage.

EXAMPLE 10

Figure 10:
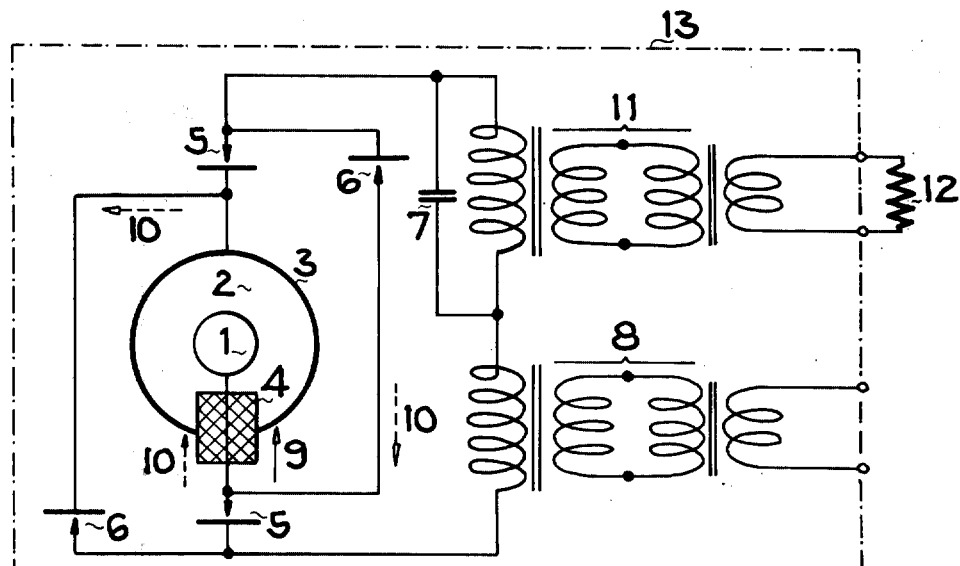
FIG. 10 shows schematically an embodiment of the invention using radio-nuclide battery.

In FIG. 10, 1 is a hollow ball of metal with an outer diameter of 50 centimeters. It is coated with a one millimeter thick layer of $^{90}$Sr-oxide, which, in all, has an activity of approximately $1.25 \cdot 10^6$ curie. On account of the large area distribution of this activity, the hollow ball 1 heats up only to about 500° kelvin. The inner wall of a second metal hollow ball 3 is located at a spacing of 20 centimeters from the surface of the hollow ball 1. An electrical connection to the hollow ball 1 is passed through the hollow ball 3 in an insulated manner through the insulator 4. The intermediate space 2 between the hollow ball 1 and the hollow ball 3 is a high vacuum. As a result of the $\beta$ radiation of the $^{90}$Sr-oxide the hollow ball 1 is charged positively and the hollow ball 3 is charged negatively. The open circuit voltage of this radio-nuclide battery amounts to 365 kilovolts, its short circuit current is 7 milliamperes. The radionuclide battery is so connected into the alternating current circuit by the capacitor 7 by means of the spark gaps 5 and 6 that, in the cae of each half wave of the electron current 9 and 10, the alternating voltage of the circuit and the voltage of the radio-nuclide battery are added. Over the innermost secondary coil of the transformer cascade 8 is applied a 50 hertz alternating voltage of effectively 380 kilovolts at the capacitor 7 with a capacitance of 59 picofarads. It limits the effective alternating current to 7 milliamperes. The transformer cascade 11 removes from the alternating current circuit a power of approximately 2.4 kilowatts which is emitted at the outermost secondary coil of the cascade 11 at an effective alternating voltage of 220 volts at the load resistance 12 of approximately 20 ohms. The entire alternating current energy converter inclusive of the spark gaps 5 and 6, the transformer cascades 8 and 11 as well as the capacitor 7 is located in the high vacuum container 13.

Alternating current energy converters in which magnetohydrodynamic converter (MHD converters) are used as direct energy converters, are of particular importance for practical applications. They offer advantages in the conversion of particularly large amounts of energy.

EXAMPLE 11

Figure 11:
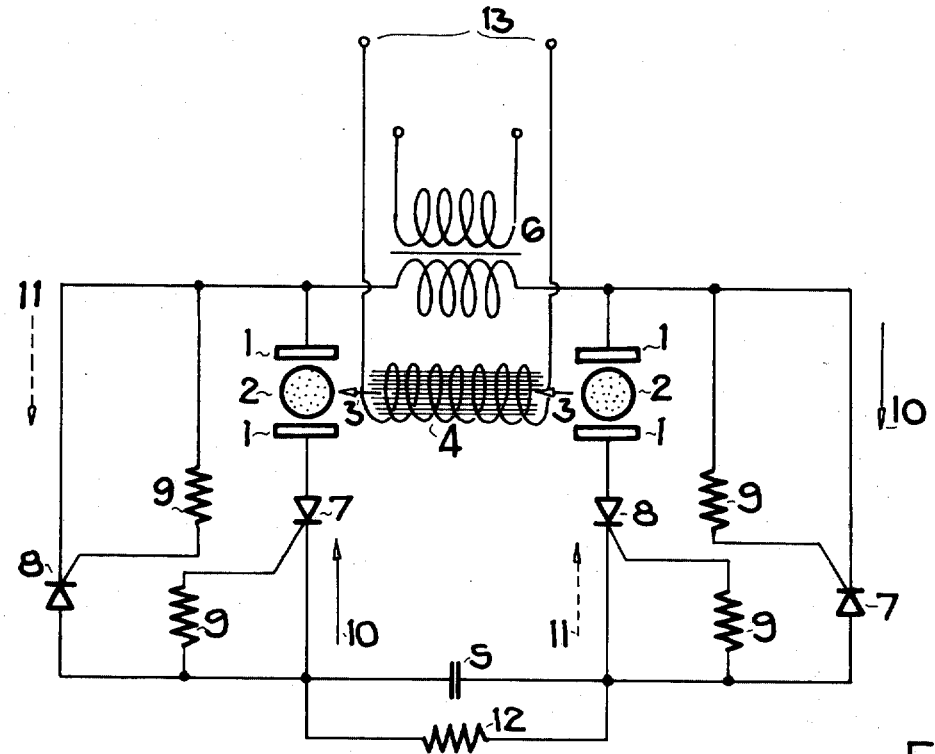
FIG. 11 shows schematically an embodiment of the invention using two MHD converters.

In FIG. 11, the jet 2 of a molten mixture of sodium/-potassium flows at right angles to the plane of the drawing in a closed circuit past the electrodes 1 of two MHD converters. The magnetic field 3 of the coil 4 which is connected to the current source 13, is at right angles to the metal jet 2 and at right angles to the electrode 1. The electrons of the metal jet 2 are braked in their mechanical movement by the magnetic field 3 and the energy amount of this braking can be removed from the mechanical energy of the metal jet 2 as electrical energy via the electrodes 1. The MHD generators are located with their inner resistances, which are formed by the electrical resistances of the metal jets 2 between the electrodes 1, in an alternating current circuit with the capacitor 5 through which a 50 hertz alternating current flows by way of the secondary coil of the transformer 6. In the first half wave, the electron current 10 flows via the thyristors 7 through the left hand MHD converter and in the second half wave the electron current 11 flows via the thyristors 8 through the right-hand MHD converter. The thyristors are so controlled by means of the resistances 9 that, with a current flow 10 and 11, the alternating voltages are added to the voltages at the electrodes 1 of the MHD converter. The electrical power emitted by the MHD generators is removed by the load resistance 12 parallel to the capacitor 5 as an alternating current power with a frequency of 50 hertz.

Example 12 describes an alternating current energy converter with a MHD converter, which operates with an open plasma jet.

EXAMPLE 12

Figure 12:
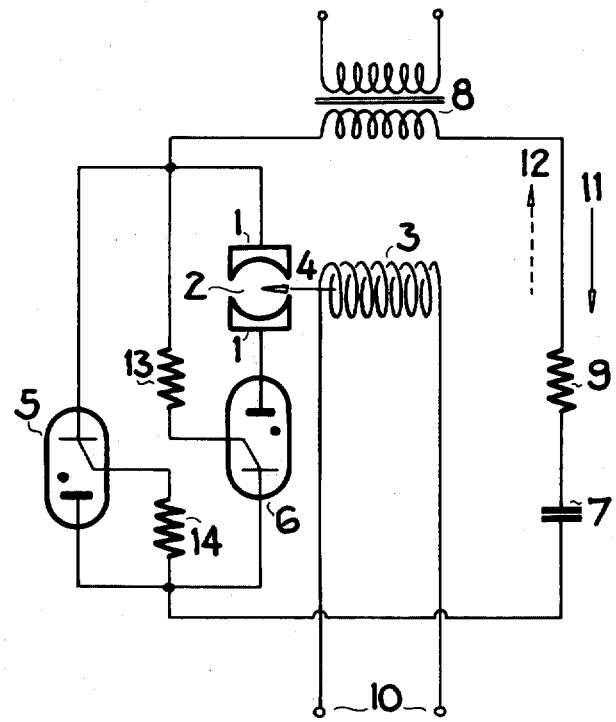
FIG. 12 shows schematically an embodiment of the invention using an MHD converter operating with an open plasma jet.

In FIG. 12 the hot flame jet 2 of hydrogen flame flows between the electrodes 1 of a MHD converter at right angles to the plane of the drawing. 4 is the magnetic field of a coil 3 which is connected to a current source 10. A 50 hertz alternating voltage is applied to the circuit with the capacitor 7 via the secondary coil of a transformer 8. The electron currents 11 and 12 of the positive and negative half waves are so controlled by means of the mercury vapour current gates 5 and 6 with the help of the resistances 13 and 14, that only the positive current half wave 11 flows through the MHD converter, in which case it is a question of addition of the voltages. The load resistance 9 in the alternating current circuit assumes the sum of the electrical power which is emitted by the transformer 8 to the circuit and which the MHD converter emits with the passage of the current half wave 11 to the alternating current circuit.

Instead of an additional magnetic field for the magnetic influencing of a direct energy converter, the non-stationary magnetic field of a coil in the alternating current circuit can also be used in the case of the alternating current energy converter. Example 13 describes an alternating current energy converter as a resonant nuclear power station with the magnetic deflection of the MHD converters through the magnetic self-consistent field of the resonator.

EXAMPLE 13

Figure 13:
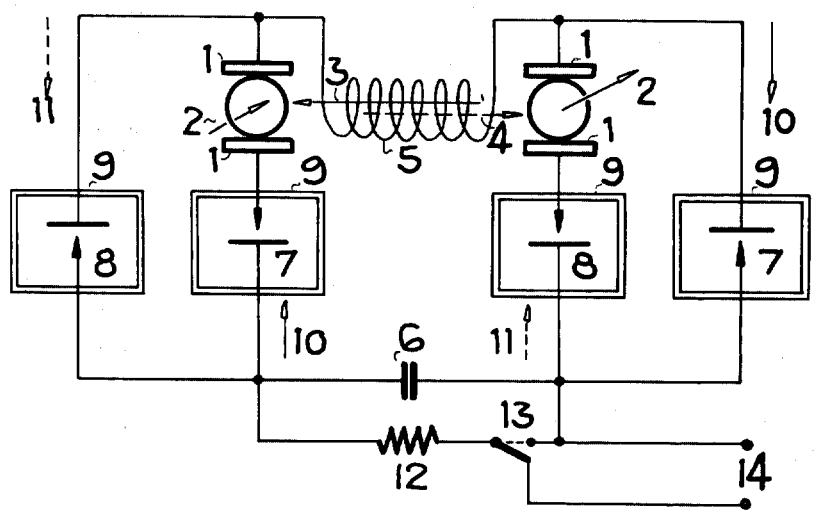
FIG. 13 shows schematically an embodiment of the invention in the form of a resonant nuclear power station.

In FIG. 13 a helium gas jet 2 in a closed circuit flows between the electrodes 1 of the two MHD converters. The helium gas jet 2 is heated to a temperature of 800 degrees centigrade with the help of a nuclear reactor. Both MHD converters are located with their internal resistance in a resonant circuit with the capacitor 6 and the coil 5. The coil 5 is superconducting and has an inductance of 1 henry. The capacitor 6 has a loss angle $\delta = 1.10^{-4}$ and a capacitance of 10 microfarads so that the natural frequency of the oscillating circuit is 50 hertz. To put it into operation, the capacitor 6 is charged by the voltage source 14 to a voltage of 440 kilovolts via the switch 13 and the resistance 12. By reversing the switch 13, the voltage source 14 is disconnected and a 50 hertz oscillation is set in motion in the resonant circuit. In the first half wave, the electron current 10 flows through the oil spark gaps 7 which are located in oil tanks 9, through the left-hand MHD converter and in the second half wave the electron current 11 flows through the oil spark gaps 8, which are located in the oil tanks 9 through the right hand MHD converter. Since the helium gas jet 2 has only the relatively low temperature of 800° centigrade, its degree of ionisation is only relatively low. The internal resistances of the MHD converter which are formed by the electrical resistances of the gas jets 2 between the electrodes 1, are correspondingly high.

This is changed drastically shortly after the beginning of each half wave of the current 10 and 11. Then a rapidly growing voltage is applied for a short time to the internal resistance of the MHD converter and, on reaching a critical value of the voltage, the current 10 or 11 flows by means of a spark-like discharge through the helium gas jet 2 between the electrodes. If the current 10 or 11 reaches its maximum in the spark-like discharge between the electrodes 1, then the currents 10 and 11 through the superconducting coil and thus also the magnetic fields 3 and 4 of the coil 5 also have their maximum. The braking of the charged particles of the helium gas jet 2 by the non-stationary magnetic fields 3 and 4 results as a consequence of this optimally with respect to time. By the spark-like discharges between the electrodes 1, the MHD converter becomes non-stationary but additionally also further a very hot plasma zone forms between the electrodes 1, which zone very strongly reduces the internal resistance of the MHD converters for a short time. In this way the magnetic fields 3 and 4 can exert their braking action on the movement of the helium gas jet 2 for a short time very much more effectively, and there results therefrom an improvement in the efficiency of the energy conversion. The resonant circuit in FIG. 13 has, with the damping by the load 12, a Q factor, and thus a voltage excess at the capacitor 6 of 100 and an effective alternating current of 5 kiloamperes flows through the coil 5. The load 12 removes from the resonant nuclear power plant according to FIG. 13 an alternating current power of 11 megawatts with a resistance of 4.4 kilohms at a voltage of 220 kilovolts.

It is obvious to use the alternating current energy converter with MHD converters also as a fusion reactor or a fusion power station, in which the electrical energy originates from the nuclear melting of hydrogen isotopes. Example 14 describes an alternating current energy converter as a resonant fusion power station.

EXAMPLE 14

Figure 14:
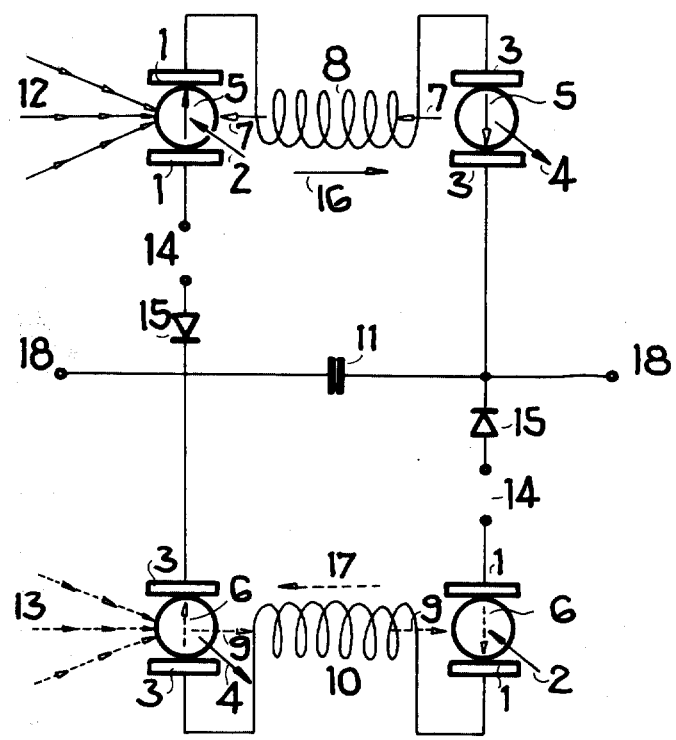
FIG. 14 shows schematically an embodiment of the invention in the form of a resonant fusion power station.

In FIG. 14, 11 is the capacitor of a resonant circuit with a natural frequency of 60 hertz, in which the electron current 16 in the first half wave flows through the coil 8 and the electron current 17 in the second half wave flows through the coil 10. Two MHD converters with the electrodes 1 operate with a closed deuterium/tritium circuit 2 and the two MHD converters with the electrodes 3 operate with the closed deuterium/tritium circuit 4. The electron current 16 in the first half wave flows via spark-like electrical discharges 5 through both deuterium/tritium circuits 2 and 4 wherein, in both circuits 2 and 4, the charged particles are braked with the help of the magnetic field 7 of the coil 8. The braking energy is fed to the capacitor 11. The electron current 17 in the second half wave flows via the spark-like electrical discharges 6 likewise via both circuits 2 and 4, wherein it converts, with the help of the magnetic field 9 of the coil 10, the braking energy of the charged particles into electrical energy which is fed to the capacitor 11. Rectifiers 15, connected in push-pull, control the phase relationship of the currents 16 and 17 and spark gaps 14 serve to control the discharge operations. During the spark-like electrical discharges 5 in the deuterium/tritium circuit 2, high energy laser pulses 12 are so simultaneously irradiated that they are superimposed in the discharge zone on the spark-like electrical discharges 5 in the form of a focus or combustion point. There they are immediately completely absorbed on account of the high electrical conductivity of the deuterium/tritium plasma. By the extreme power density, achieved thereby, for a short time such a high temperature is reached in this focus or combustion point that a nuclear fusion of deuterium and tritium nuclei, restricted with respect to amount, occurs. The energy of the mass defect appears as radiation, heat and mechanical energy of the deuterium/tritum circuit 2. The same operation takes place in the second half wave of the electron current 17 in the discharge zone of the spark-like electrical discharges 6 of the deuterium/-tritium circuit 4 with laser pulses 13. A part of the released nuclear fusion energy is removed as electrical energy from the resonant fusion power plant via the connections 18. Nuclear fusion can also be achieved without the laser pulses 12 and 13 with sufficiently high current densities in the spark-like electrical discharges 5 and 6.

Since the spark-like electrical discharges used and produced in the alternating current energy converter can discharge even nonionised, gas gaps or even vacuum gaps, an alternating current energy converter with a MHD converter can also operate as a turbine or a jet power plant. The example 15 describes such a turbine.

EXAMPLE 15

Figure 15:
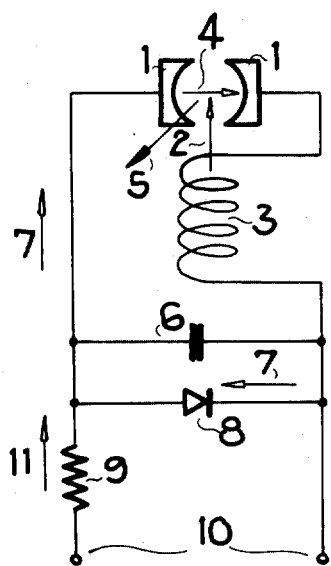
FIG. 15 shows schematically an embodiment of the invention as a turbine.

In FIG. 15, 1 are the electrodes of an MHD converter, 2 is the deflecting magnetic field of the coil 3 of the resonant circuit with the capacitor 6. Connected to terminals 10 is a high voltage generator, which charges the capacitor 6 again and again with the electron current 11 via resistance 9 to such a high voltage that the air gaps between the electrodes 1 of the MHD converter are broken down by spark-like electrical discharges 4. The electron current 7 flowing synchronously with the spark-like electrical discharges 4 through the coil 3 produces the magnetic field 2 which accelerates the charges particles of the spark plasma between the electrodes 1 in the direction 5. By the repetition of this operation, 5 becomes an ion and gas jet which drives a turbine. The capacitor 6 is bridged by the rectifier 8 so that the electrical energy in the MHD converter not used for the acceleration of the charged particles contributes, with the current 7, is used for the recharging of the capacitor 6.

With the bridging of the resonant circuit capacitor 6 by the rectifier 8 in example 15, the current in this alternating current energy converter is forced to flow as rectified current through the internal resistance of the direct energy converter.

Example 16 describes an alternating current energy converter as a functional unit of generator and jet power plant.

EXAMPLE 16

Figure 16:
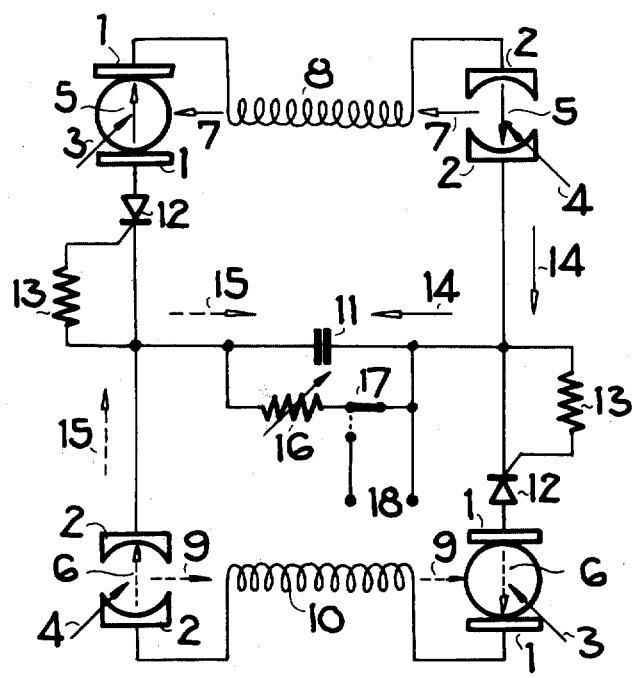
FIG. 16 shows schematically an embodiment of the invention operating as a nuclear jet power plant.

In FIG. 16, 11 is a vacuum capacitor of a resonant circuit in which electron current 14, in the first half wave, flows through a coil 8 and the electron current 15 in the second half wave flows through a coil 10. 3 is a closed inert gas circuit which is heated by a nuclear reactor to a temperature of 1,000° kelvin. 1 are the electrodes of the two MHD converters with the closed inert gas circuit 3. They operate as generators. The two MHD converters with the open circuits 4 have electrodes 2 and operate as jet power plants. The closed inert gas circuit 3 and the open circuit 4 are simultaneously broken down by the spark-like electrical discharges 5 or 6 respectively both in the first and in the second half wave of each oscillation. The electrical energy which is obtained in the first half wave of the electron current 14 by the braking of the charged particles in the closed inert gas circuit 3 (with the help of the magnetic field 7 of the coil 8) is converted by the acceleration of the charged particles through the same magnetic field 7 in the open circuit 4 into mechanical drive energy. The same happens in the second half wave of the electron current 15 with the help of the magnetic field 9 of the coil 10. The nuclear reactor supplies by means of the heated inert gas circuit 3 the energy of two ion or electron jet power plants which also operate in vacuo. The coils 8 and 10 are superconducting, the thyristors 12 are switched in and switched out via the resistances 13 in time with the natural frequency of the oscillating circuit. Additionally electrical energy for other purposes can be taken from the resonant circuit by means of the variable load resistance 16. The resonant circuit is excited by the charging of the capacitor 11 with the help of the voltage source 18 via the switch 17 and the variable resistance 16 as well as the subsequent discharge of the capacitor 11 into the resonant circuit. The braking and disconnection of the oscillation is effected by a reduction of the resistance 16. If the damping of the resonant circuit is so large that the voltage at the capacitor 11 is no longer sufficient to force the spark-like electrical discharges 5 and 6, then the oscillations collapse. The thyristors 12 in FIG. 16 represent relatively larger switch units.

Mechanical drive and movement units of every type and size can be produced by the combination of alternating current energy converters as generators, which provide rotating electric motors and linear motors with electrical energy.

When using alternating current energy converters with MHD converters, in addition, also jet power plants and turbines can be produced which use the direct mechanical acceleration of the electrically charged particles.

Alternating current energy converters are, on account of their high efficiency and their adaptability to any required power size particularly suitable as electrical drives, electrical turbines and jet power plants for land, sea, air and space vehicles.

For the better adaptation of power, current and voltage to the multiple problems of their use, several and different direct energy converters and several alternating current energy converters can also be connected electrically in parallel and in series. In this way, e.g. in manner known per se, also multiphased alternating current can be produced.

It will be understood that the above description of the present invention is susceptible to various modifications changes and adaptations.

What is claimed is:

1. An alternating current energy converter in which a direct energy converter is connected into an alternating current circuit, in which means are provided by which a current flows as a rectified current through the electrical internal resistance of said direct energy converter and in which a reactance is provided for limiting the current in said alternating current circuit.

2. An alternating current energy converter as defined in claim 1, wherein the reactance is an inductance and/or a capacitance.

3. An alternating current energy converter as defined in claim 1, wherein the reactance is greater than the internal resistance of said direct energy converter.

4. An alternating current energy converter as defined in claim 1, wherein the alternating current is so guided with the help of switches in said alternating current circuit that current flows through said internal resistance of said direct energy converter as rectified current.

5. An alternating current energy converter as defined in claim 1, and comprising a coil connected in series with said internal resistance of said direct energy converter, a capacitor in parallel with this series circuit and a rectifier or diode bridging said capacitor for ensuring that the current flows as rectified current through said internal resistance of said direct energy converter.

6. An alternating current energy converter as defined in claim 1, and comprising alternating current used having any suitable amplitude form.

7. An alternating current energy converter as defined in claim 1, wherein said alternating current circuit carries out resonant oscillations or natural oscillations.

8. An alternating current energy converter as defined in claim 1, wherein said direct energy converters comprise converters for converting heat into electrical energy or electrical energy reversibly into heat.

9. An alternating current energy converter as defined in claim 1, wherein said direct energy converts comprise thermoelements or Peltier elements which have one or more interruption points which the current bridges by means of arc-like or spark-like electrical discharges.

10. An alternating current energy converter as defined in claim 1, wherein said direct energy converters comprise converters for converting light into electrical energy or electrical energy into light.

11. An alternating current energy converter as defined in claim 1, wherein said direct energy converters comprise converters for converting radioactive radiation into electrical energy.

12. An alternating current energy converter as defined in claim 1, wherein said direct energy converters comprise converters for converting chemical energy into electrical energy or electrical energy into chemical energy.

13. An alternating current energy converter as defined in claim 1, wherein said direct energy converters comprise converters for converting mechanical energy into electrical energy or electrical energy into mechanical energy.

14. An alternating current energy converter as defined in claim 1, and comprising a non-stationary magnetic field of a coil in the alternating current circuit for magnetic influencing the direct energy converter.

15. An alternating current energy converter as defined in claim 1, wherein the amplitude frequency or phase of the alternating current is modulated.

16. An alternating current energy converter as defined in claim 1, including at least one further direct energy converter electrically connected in series with said direct energy converter in said alternating current circuit, and at least one further plurality of direct energy converters connected electrically in parallel with the series connection of said direct energy converter and said at least one further direct energy converter.

* * * * *